(12) United States Patent
Dadvand et al.

(10) Patent No.: US 12,237,219 B2
(45) Date of Patent: Feb. 25, 2025

(54) CONTACT WITH BRONZE MATERIAL TO MITIGATE UNDERCUT

(71) Applicant: Texas Instruments Incorporated, Dallas, TX (US)

(72) Inventors: Nazila Dadvand, Richardson, TX (US); Christopher Daniel Manack, Flower Mound, TX (US); Salvatore Frank Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 803 days.

(21) Appl. No.: 17/038,947

(22) Filed: Sep. 30, 2020

(65) Prior Publication Data

US 2021/0028060 A1    Jan. 28, 2021

Related U.S. Application Data

(62) Division of application No. 16/022,956, filed on Jun. 29, 2018, now Pat. No. 10,796,956.

(51) Int. Cl.
*H01L 23/00*   (2006.01)
*H01L 21/768*  (2006.01)
*H01L 23/532*  (2006.01)

(52) U.S. Cl.
CPC .. *H01L 21/76873* (2013.01); *H01L 23/53238* (2013.01); *H01L 24/11* (2013.01); *H01L 24/13* (2013.01); *H01L 24/49* (2013.01); *H01L 2224/13157* (2013.01)

(58) Field of Classification Search
None
See application file for complete search history.

(56) References Cited

U.S. PATENT DOCUMENTS

| | | | |
|---|---|---|---|
| 4,374,744 A | 2/1983 | Kawanabe et al. | |
| 6,551,931 B1 * | 4/2003 | Edelstein | H05K 3/244 |
| | | | 438/678 |
| 6,875,692 B1 | 4/2005 | Chang et al. | |
| 2002/0045036 A1 * | 4/2002 | Gorrell | H05K 3/244 |
| | | | 428/209 |
| 2005/0245065 A1 | 11/2005 | Motoyama | |
| 2006/0027930 A1 * | 2/2006 | Edelstein | H01L 23/53238 |
| | | | 257/762 |
| 2010/0237489 A1 | 9/2010 | Manack et al. | |
| 2012/0162958 A1 | 6/2012 | Rother | |
| 2012/0211884 A1 | 8/2012 | Stepniak et al. | |
| 2013/0193569 A1 | 8/2013 | Han et al. | |
| 2014/0287577 A1 * | 9/2014 | Emesh | H01L 23/53238 |
| | | | 438/618 |

(Continued)

*Primary Examiner* — Lex H Malsawma
(74) *Attorney, Agent, or Firm* — Ronald O. Neerings; Frank D. Cimino

(57) ABSTRACT

Described examples provide microelectronic devices and fabrication methods, including fabricating a contact structure by forming a titanium or titanium tungsten barrier layer on a conductive feature, forming a tin seed layer on the barrier layer, forming a copper structure on the seed layer above the conductive feature of the wafer or die, heating the seed layer and the copper structure to form a bronze material between the barrier layer and the copper structure, removing the seed layer using an etching process that selectively removes an exposed portion of the seed layer, and removing an exposed portion of the barrier layer.

20 Claims, 16 Drawing Sheets

(56) References Cited

U.S. PATENT DOCUMENTS

| | | |
|---|---|---|
| 2015/0061103 A1 | 3/2015 | Manack et al. |
| 2016/0351520 A1* | 12/2016 | Jiang ...................... H01L 24/13 |
| 2016/0379953 A1 | 12/2016 | Thompson et al. |
| 2017/0033057 A1 | 2/2017 | Han et al. |
| 2017/0117238 A1 | 4/2017 | Romig et al. |

* cited by examiner

CONTACT WITH BRONZE MATERIAL TO MITIGATE UNDERCUT

This application is a Divisional of application Ser. No. 16/022,956 filed Jun. 29, 2018.

BACKGROUND

Microelectronic devices, such as integrated circuits and discrete devices, include one or more electronic components, such as transistors, capacitors, inductors, etc. Microelectronic devices are packaged with one or more externally accessible connections for eventual soldering to a user's printed circuit board (PCB). A variety of different microelectronic device package types are available, including structures with pins or pads, as well as flip-chip packages. Conductive contacts on a semiconductor die are soldered to conductive features on a lead frame using bond wires for electrical connection to pins or pads, or the die contacts are soldered to a product substrate or chip carrier for flip-chip packages. Low impedance connection of the conductive contacts to electronic devices within the semiconductor die are desired. However, undercutting during formation of the conductive contacts on the semiconductor die can increase the impedance and/or degrade the mechanical integrity of the conductive contact structure. Undercut issues can result from faster etching away of sputtered seed copper versus electroplated copper of a die contact pillar or post due to galvanic corrosion of the sputtered copper seed formed on an underlying barrier layer.

SUMMARY

Described examples provide methods to fabricate a contact structure, including forming a titanium or titanium tungsten barrier layer on a conductive feature of a wafer or die, forming a tin seed layer on the barrier layer, and forming a copper structure on the seed layer above the conductive feature. The method further includes heating the seed layer and the copper structure to form a bronze material between the barrier layer and the copper structure, removing an exposed portion of the seed layer, and removing an exposed portion of the barrier layer. Further described provide a microelectronic device that includes an electronic component disposed on or in a semiconductor substrate of a wafer or die, a metallization structure, and a contact structure. The contact structure includes a barrier layer disposed at least partially on a conductive feature of the metallization structure, a copper structure that extends at least partially outward from a side of the metallization structure, and a bronze material disposed between the barrier layer and the copper structure.

DETAILED DESCRIPTION

Figure 1:
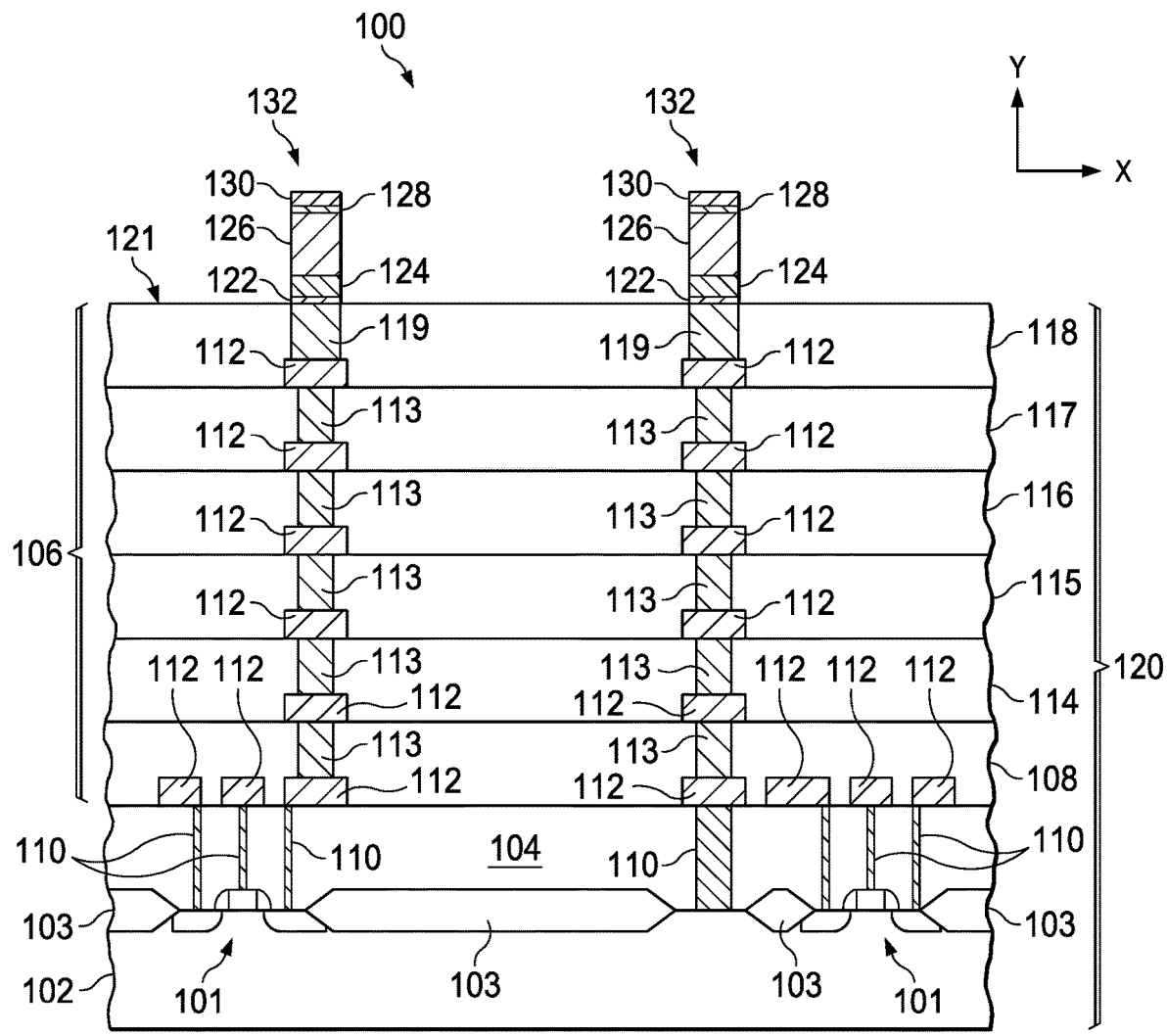
FIG. 1 is a partial sectional side elevation view of a microelectronic device with contact structures having bronze material between a barrier layer and a copper pillar structure.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a microelectronic device 100 that includes electronic components 101 (e.g., metal oxide semiconductor (MOS) transistors) disposed on or in a semiconductor substrate 102. Although the example microelectronic device 100 is an integrated circuit with multiple components 101, other microelectronic device implementations can include a single electronic component. The semiconductor substrate 102 in one example is a silicon wafer, a silicon-on-insulator (SOI) substrate or other semiconductor structure. One or more isolation structures 103 are formed on select portions of the upper surface of the substrate 102. The isolation structures 103 can be shallow trench isolation (STI) features or field oxide (FOX) structures in some examples.

A multi-layer metallization structure 104, 106 is disposed above the substrate 102. The metallization structure includes a first dielectric structure layer 104 formed above the substrate 102, and a multi-level upper metallization structure 106. In one example, the first dielectric 104 structure layer is a pre-metal dielectric (PMD) layer disposed above the components 101 and the upper surface of the substrate 102. In one example, the first dielectric structure layer 104 includes silicon dioxide ($SiO_2$) deposited over the components 101, the substrate 102 and the isolation structures 103. In one example, the upper metallization structure 106 is a multi-layer structure. In one example, the multi-layer structure is formed as a multi-layer metallization structure using integrated circuit fabrication processing. FIG. 1 shows an example 6 layer upper metallization structure 106, including a first layer 108, referred to herein as an interlayer or interlevel dielectric (ILD) layer. Different numbers of layers can be used in different implementations. In one example, the first ILD layer 108, and the other ILD layers of the upper metallization structure 106 are formed of silicon dioxide ($SiO_2$) or other suitable dielectric material. In certain implementations, the individual layers of the multi-layer upper metallization structure 106 are formed in two stages, including an intra-metal dielectric (IMD, not shown) sub layer and an ILD sublayer overlying the IMD sub layer. The individual IMD and ILD sublayers can be formed of any suitable dielectric material or materials, such as $SiO_2$-based dielectric materials.

Tungsten or other conductive contacts 110 extend through selective portions of the first dielectric structure layer 104.

The first ILD layer 108, and the subsequent ILD layers in the upper metallization structure 106 include conductive metallization interconnect structures 112, such as aluminum formed on the top surface of the underlying layer. In this example, the first layer 108 and the subsequent ILD layers also include conductive vias 113, such as tungsten, providing electrical connection from the metallization features 112 of an individual layer to an overlying metallization layer. The example of FIG. 1 includes a second layer 114 disposed over the first layer 108. The second ILD layer 114 includes conductive interconnect structures 112 and vias 113. The illustrated structure includes further metallization levels with corresponding dielectric layers 115, 116 and 117, as well as an uppermost or top metallization layer 118. The substrate 102, the electronic components 101, the first dielectric structure layer 104 and the upper metallization structure 106 constitute a wafer or die 120 with an upper side or surface 121. The individual layers 115-118 in this example include conductive interconnect structures 112 and associated vias 113.

The top metallization layer 118 includes two example conductive features 119, such as upper most aluminum vias. The conductive features 119 include a side or surface at the upper side 121 of the wafer or die 120 at the top of the uppermost metallization layer 118. Any number of conductive features 119 may be provided. One or more of the conductive features 119 can be electrically coupled with an electronic component 101. The upper ILD dielectric layer 118 in one example is covered by one or more protection layers (e.g., protective overcoat (PO) and/or passivation layers, not shown), for example, silicon nitride (SiN), silicon oxynitride ($SiO_xN_y$), or silicon dioxide ($SiO_2$). In one example, the protection layer or layers include one or more openings that expose a portion of the conductive features 119 to allow electrical connection of the features 119 to corresponding contact structures.

The microelectronic device 100 of FIG. 1 also includes two example contact structures 132. Each contact structure 132 is electrically coupled with corresponding one of the conductive features 119. The individual contact structures 132 include a barrier layer 122 disposed at least partially on the corresponding conductive feature 119, along with a copper structure 126 that extends at least partially outward (e.g., upward in FIG. 1) from the upper side 121 of the wafer or die 120. The individual contact structures 132 also include a bronze material 124 disposed between the barrier layer 122 and the copper structure 126. In one example, the bronze material layer 124 has a thickness of 300 μm or more and 800 μm or less (e.g., along the vertical or Y-axis direction in FIG. 1). In one example, the barrier layer 122 includes titanium (Ti) or titanium tungsten (TiW). In one example, the barrier layer 122 has a thickness that is less than the thickness of the bronze material layer 124.

In one example, the copper structure 126 provides a copper pillar or post for subsequent soldering to a flip-chip substrate or chip carrier, or for soldering to a bond wire during packaging. The bronze material 124 in one example provides electrically conductive coupling between the copper structure 126 and the barrier layer 122. In one example, the lateral dimensions of the barrier layer 122, the bronze material 124 and the copper structure 126 (e.g., along the X-axis direction in FIG. 1) are approximately equal to one another. In particular, the lateral dimensions of the bronze material 124 and the copper structure 126 are substantially equal in one implementation due to a reduction or elimination of undercutting of the bronze material 124 beneath the copper structure 126 during fabrication. This facilitates low impedance coupling of the copper structure 126 with the conductive features 119 of the wafer or die 120.

In one example, the contact structure 132 further includes solder 130, such as tin silver (SnAg) on or above the copper structure 126, although not required for all possible implementations. In one example, the contact structure 132 further includes a diffusion barrier layer 128, such as a nitride material disposed between the copper structure 126 and the solder 130, although other implementations are possible in which the diffusion barrier layer 128 and/or the solder 130 are omitted. In another example, the copper structure 126 is directly soldered to a chip carrier substrate or to a bond wire using solder supplied during a packaging process.

Figure 2:
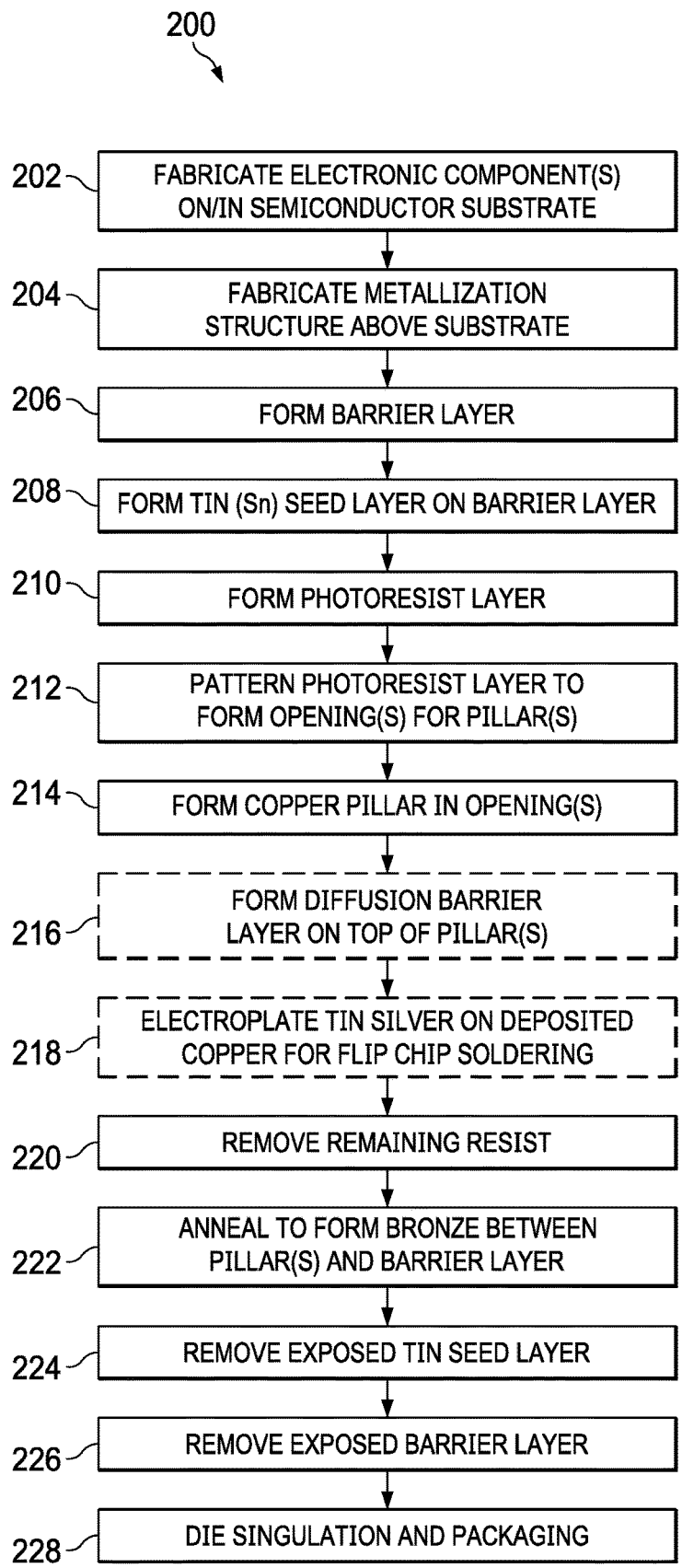
FIG. 2 is a flow diagram of a method of fabricating a microelectronic device and a contact structure thereof.
Figure 3:
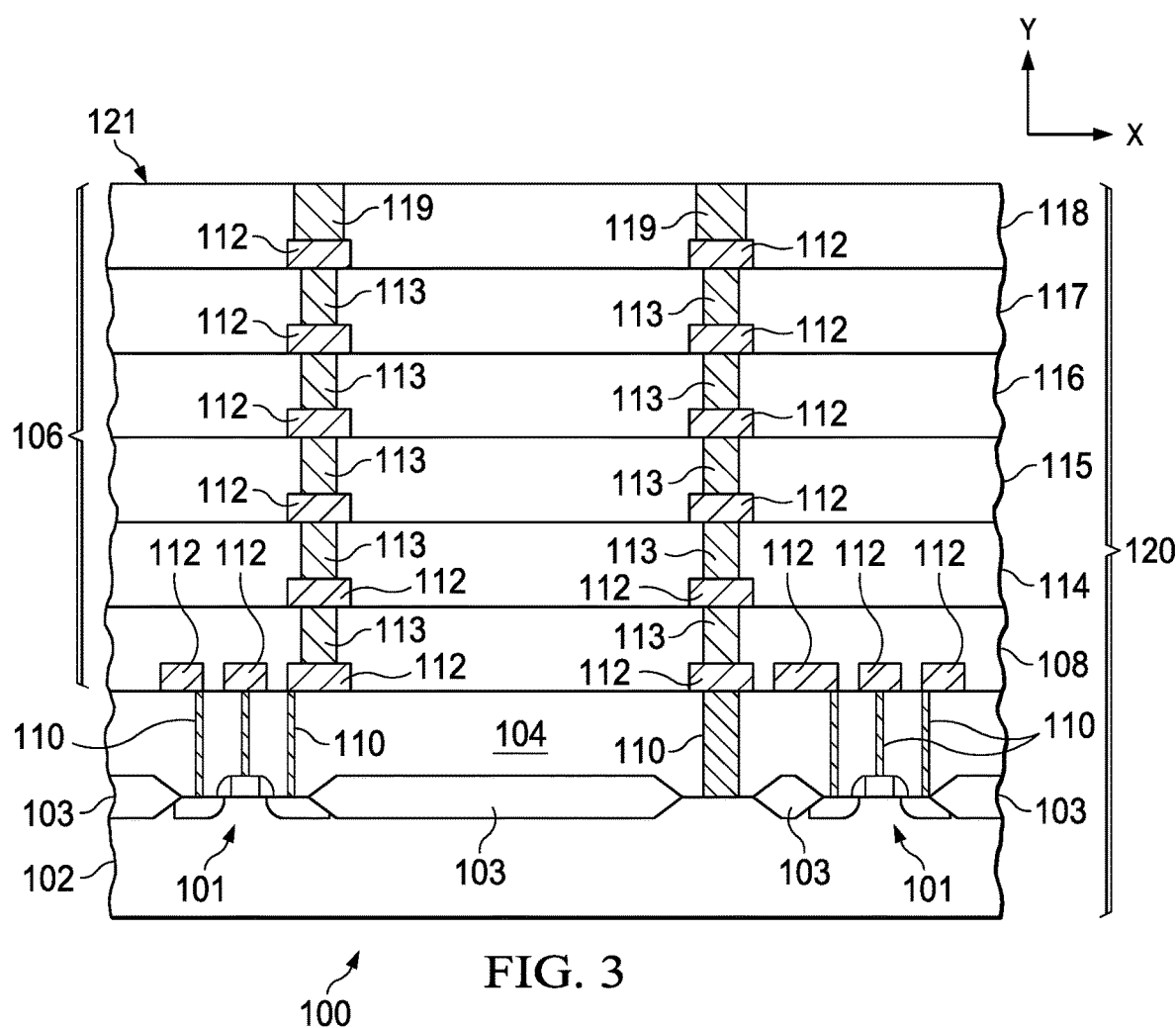
FIGS. 3-13 are partial sectional side elevation views of a microelectronic device undergoing fabrication processing according to the method of FIG. 2.

FIG. 2 shows a method 200 of fabricating a microelectronic device, such as the device 100 of FIG. 1. The example method 200 includes a process or method to fabricate a contact structure of an electronic apparatus, such as the contact structures 132 in FIG. 1. FIGS. 3-13 illustrate processing at various intermediate stages of fabrication to produce the device 100 of FIG. 1 according to the method 200. The method 200 begins with fabricating one or more electronic components on and/or in a substrate at 202. Any suitable semiconductor processing steps can be used at 202 in order to fabricate one or more electronic components on and/or in a semiconductor substrate 102. For example, the processing at 202 can include fabricating one or more transistors 101 on and/or in the semiconductor substrate 102 as shown in FIG. 3. In one example, the fabrication at 202 includes fabrication of additional structural features, such as isolation structures 103 shown in FIG. 3. The method 200 of FIG. 2 further includes fabricating a metallization structure above the substrate at 204 (e.g., first dielectric structure layer 104 and an upper metallization structure 106 above the substrate 102 in FIG. 3). In certain examples, construction of the metallization structure at 204 can further include fabrication of one or more additional electronic components (e.g., resistors, inductors, capacitors, transformers, not shown) at least partially in the metallization structure. The processing at 202 and 204 in one example provides a wafer 120 as shown in FIG. 3.

Figure 4:
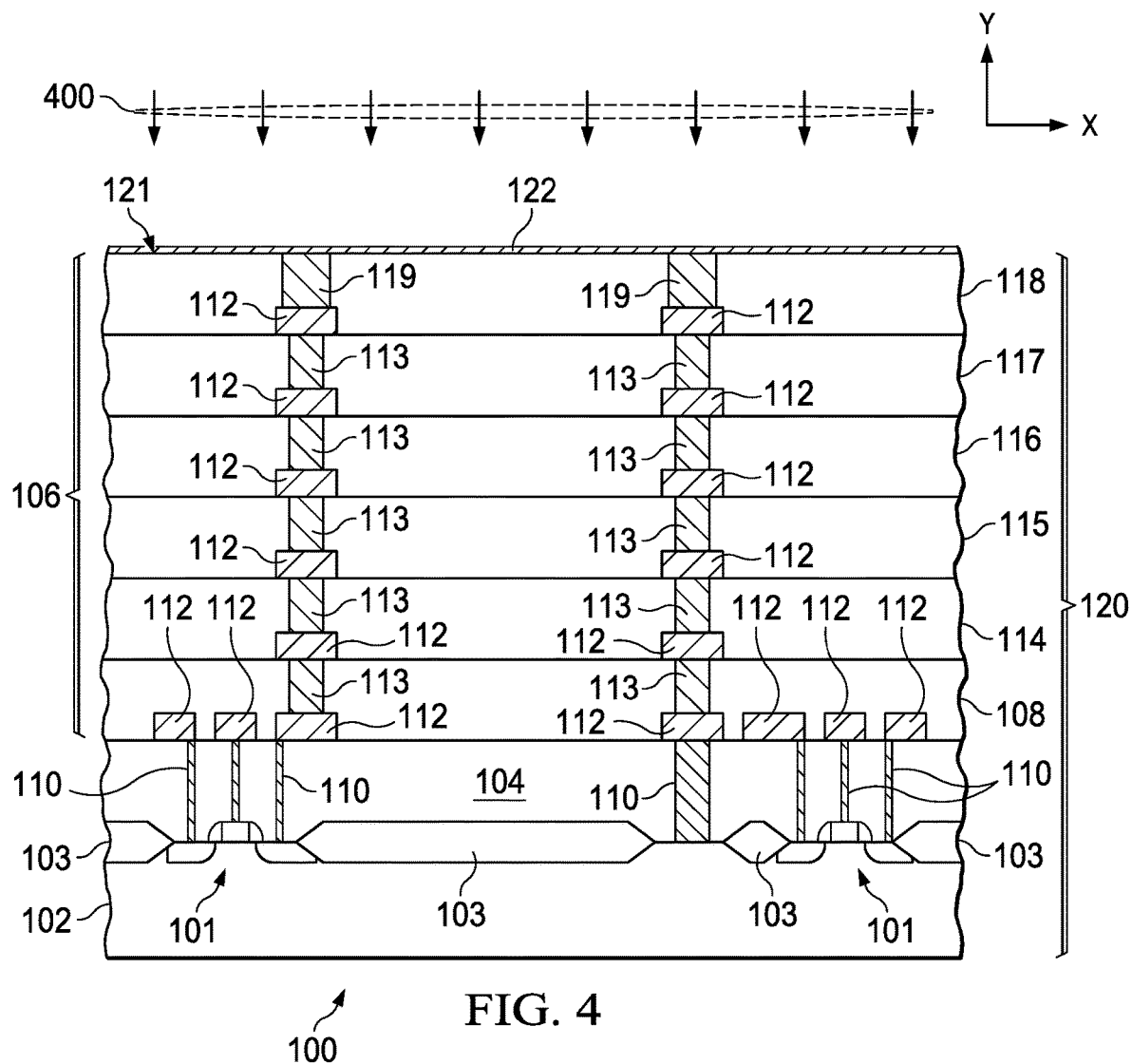

Further processing at 206-226 in FIG. 2 provides an included method for fabricating a contact structure, such as the contact structure 132 in FIG. 1. In this example, the method 200 includes forming a barrier layer at least partially on a conductive feature of the wafer 120 at 204. FIG. 4 shows one example, including performing a sputtering or electroplating deposition process 400 that deposits the barrier layer 122 on the upper side 121 of the wafer 120. In one example, the deposition process 400 forms a titanium or titanium tungsten material barrier layer 122 on the wafer side 121, which extends at least partially on the conductive features 119 of the wafer 120.

Figure 5:
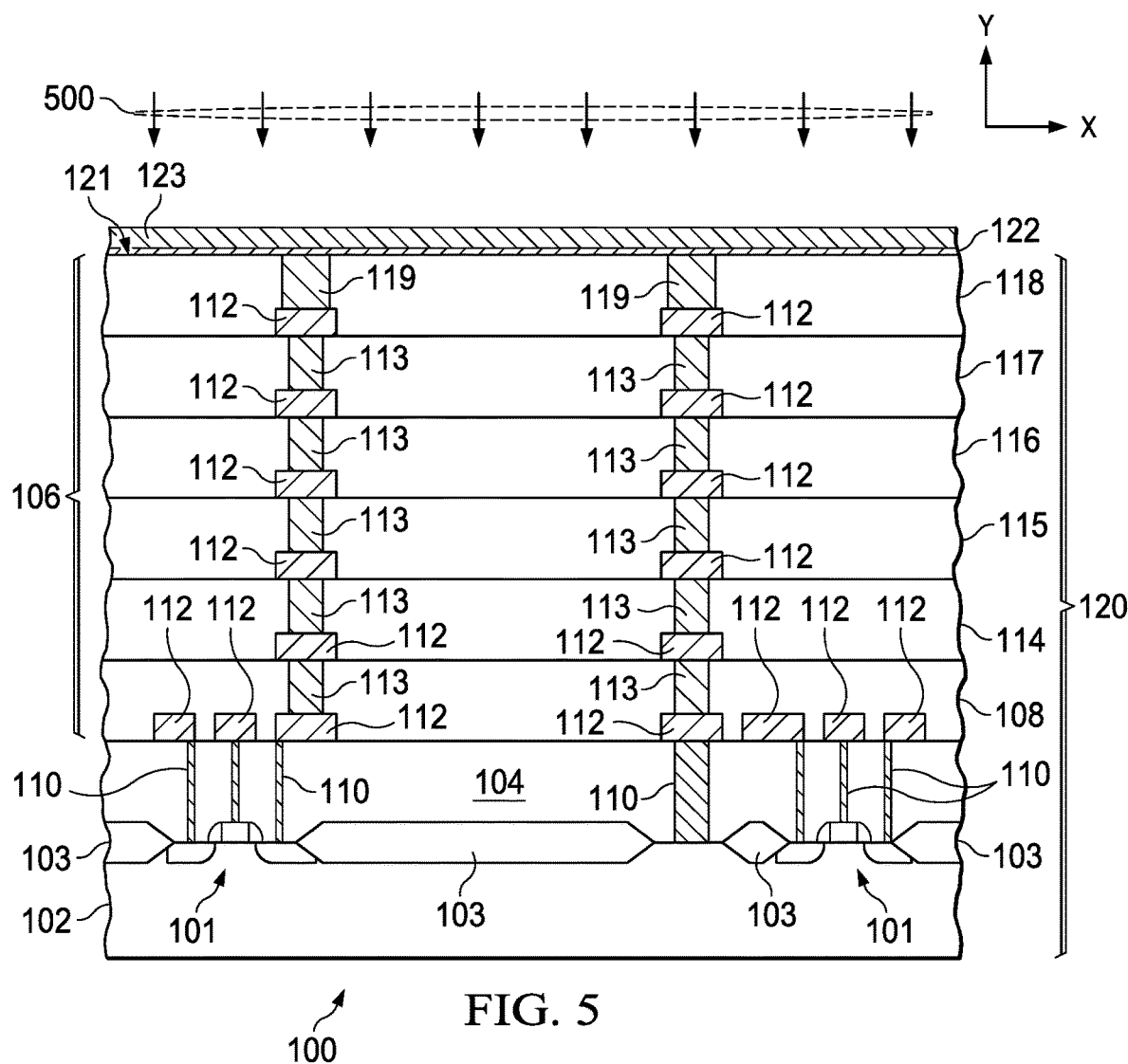

The method 200 further includes forming a seed layer on the barrier layer at 208. FIG. 5 shows one example, including performing a deposition process 500 that forms a tin (Sn) seed layer 123 on the barrier layer 122. In one example, the deposition process 500 forms the tin seed layer 123 to a thickness of 300 μm or more and 800 μm or less. In one example, the process 500 is a sputtering process that deposits tin directly on a TiW or Ti barrier layer 122. In another example, an electroplating deposition process 500 can be used to form the tin seed layer 123 on the barrier layer 122. The seed layer 123 in one example provides a conductive material to facilitate subsequent electroplating to form a copper structure (e.g., copper structure 126 in FIG. 1). Moreover, the use of tin for the seed layer 123 facilitates subsequent formation of bronze above the barrier layer 122

(e.g., bronze 124 in FIG. 1), and further facilitates removal of portions of the bronze 124 without significant undercutting. In this regard, using sputtered copper for a seed layer can lead to undesirable undercutting during subsequent etching, in which the etch process preferentially removes sputtered copper seed layer material at a higher etch rate than overlying electroplated copper. The use of deposited tin and subsequently formed bronze for the seed layer material according to the process 200 advantageously reduces or mitigates undercutting, and facilitates construction of low impedance contact structures to allow soldering during subsequent packaging operations with low impedance electrical coupling to the conductive features 119 of the wafer 120.

Figure 6:
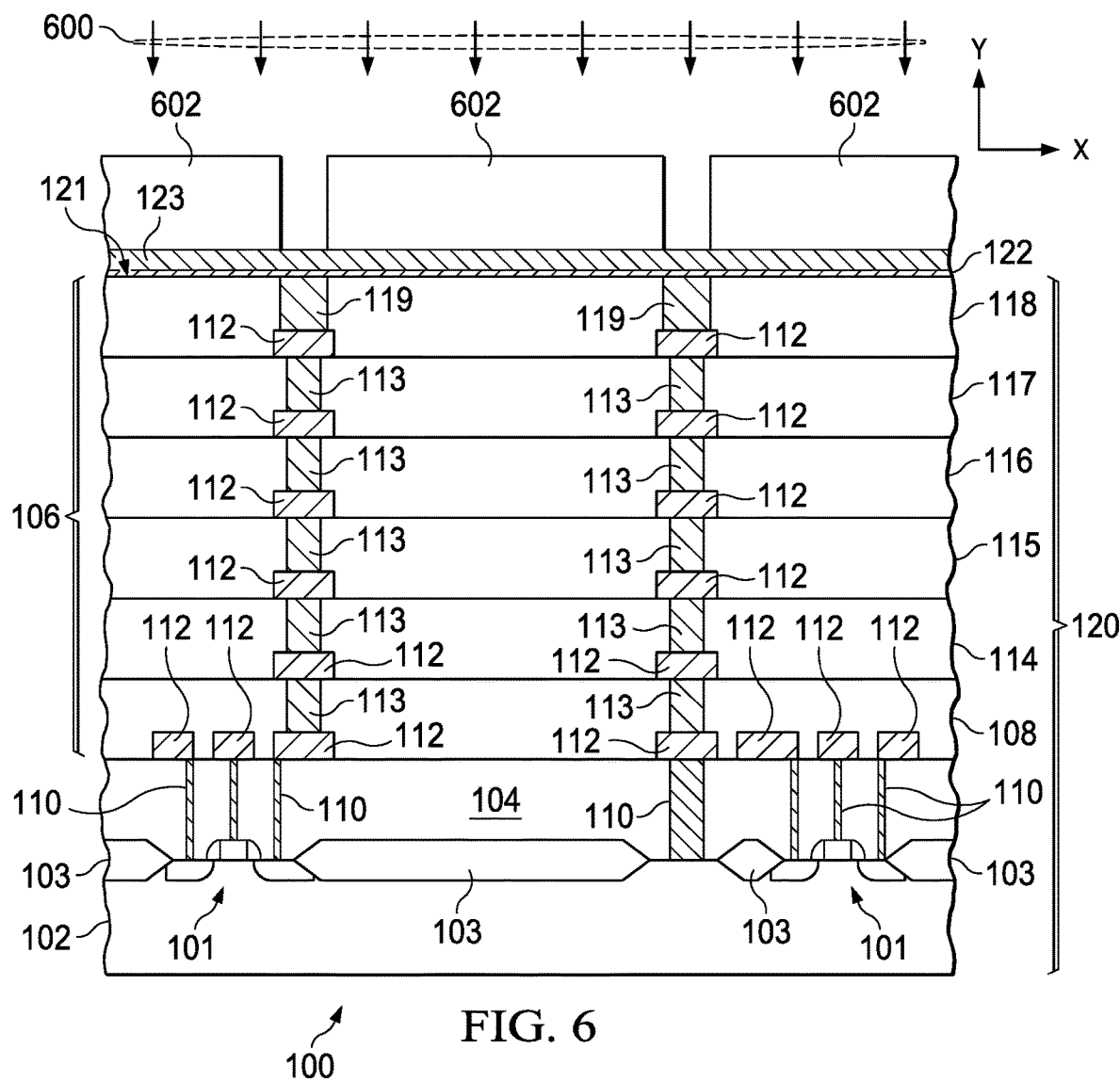
Figure 7:
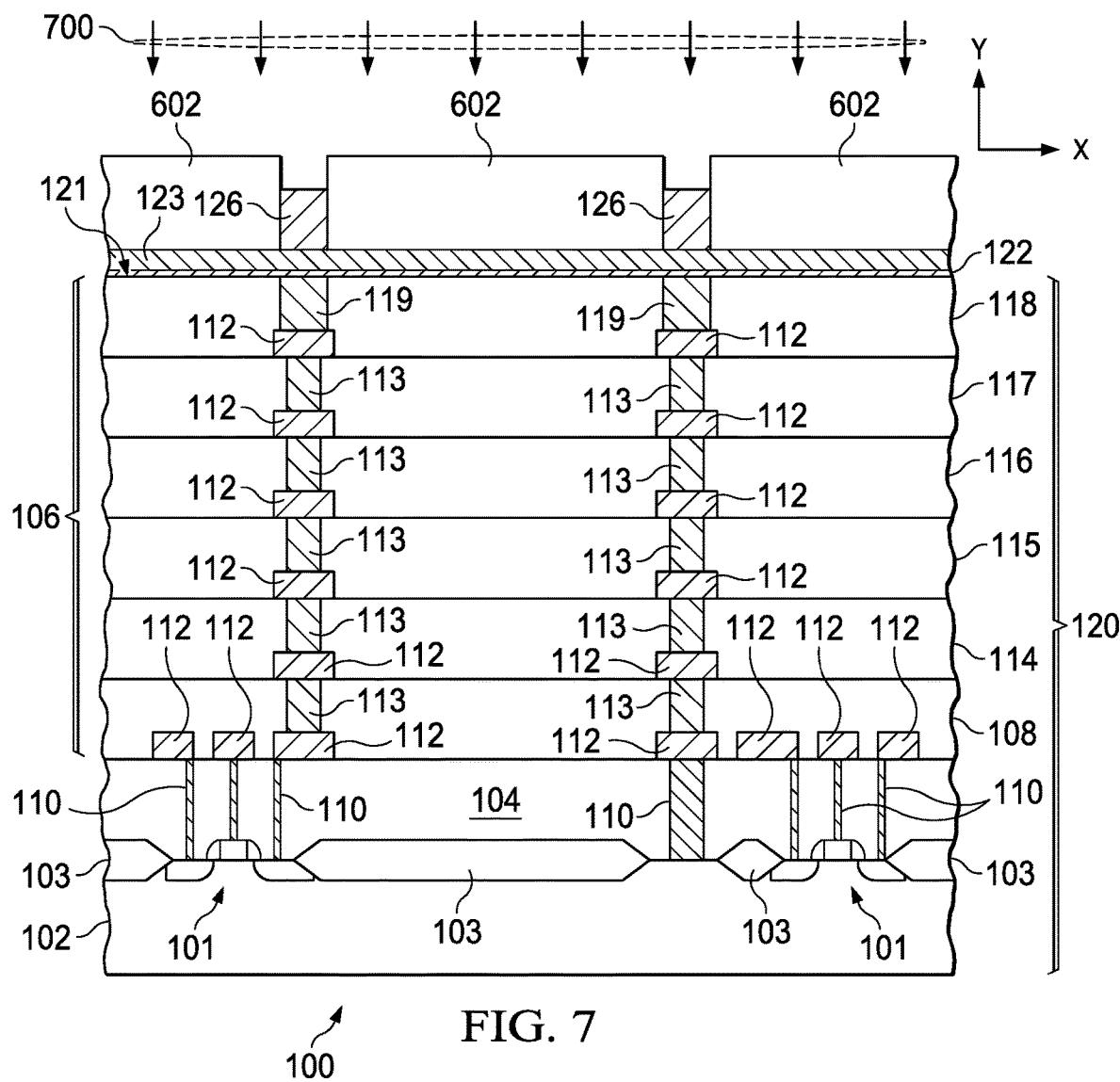

The method 200 continues in FIG. 2 with formation of a copper post or pillar structure above the deposited seed layer at 210, 212 and 214. One example implementation includes forming a photoresist layer at 210, and patterning the photoresist layer at 212 to form openings for pillars. FIG. 6 shows an example deposition process 600 that deposits and patterns a photoresist material layer 602 on the tin seed layer 123. The photoresist layer 602 in one example is patterned at 212 using a photolithography process that selectively removes portions of the photoresist material 602 to expose portions of the tin seed layer 123 above the conductive features 119 of the wafer 120. The lateral (X-axis) width of the openings in the photoresist layer 602 in one example is generally coextensive with the lateral width of the conductive features 119 of the wafer 120, although not a requirement of all possible implementations. The copper structure formation in this example includes depositing copper material at 214 on the exposed portion of the tin seed layer 123 above the conductive feature. FIG. 7 shows one example, including performing an electroplating deposition process 700 that forms the copper structures 126 in the openings of the photoresist 602. The process 700 forms the copper structures 126 on the exposed portions of the seed layer 123 above the conductive features 119 of the wafer 120. As previously mentioned, the use of the initially tin barrier layer 123 directly under the deposited copper structures 126, and the subsequent reaction to form bronze 124 below the electroplated copper structures 126 advantageously mitigates or avoids undercutting during subsequent etching steps during fabrication of the microelectronic device 100. In addition, the use of a thin tin barrier layer 123 (e.g., 300 to 800 μm) advantageously mitigates or avoids formation of Kirkendall voids at the interface of the copper post structures 126 and the tin seed layer 123.

Figure 8:
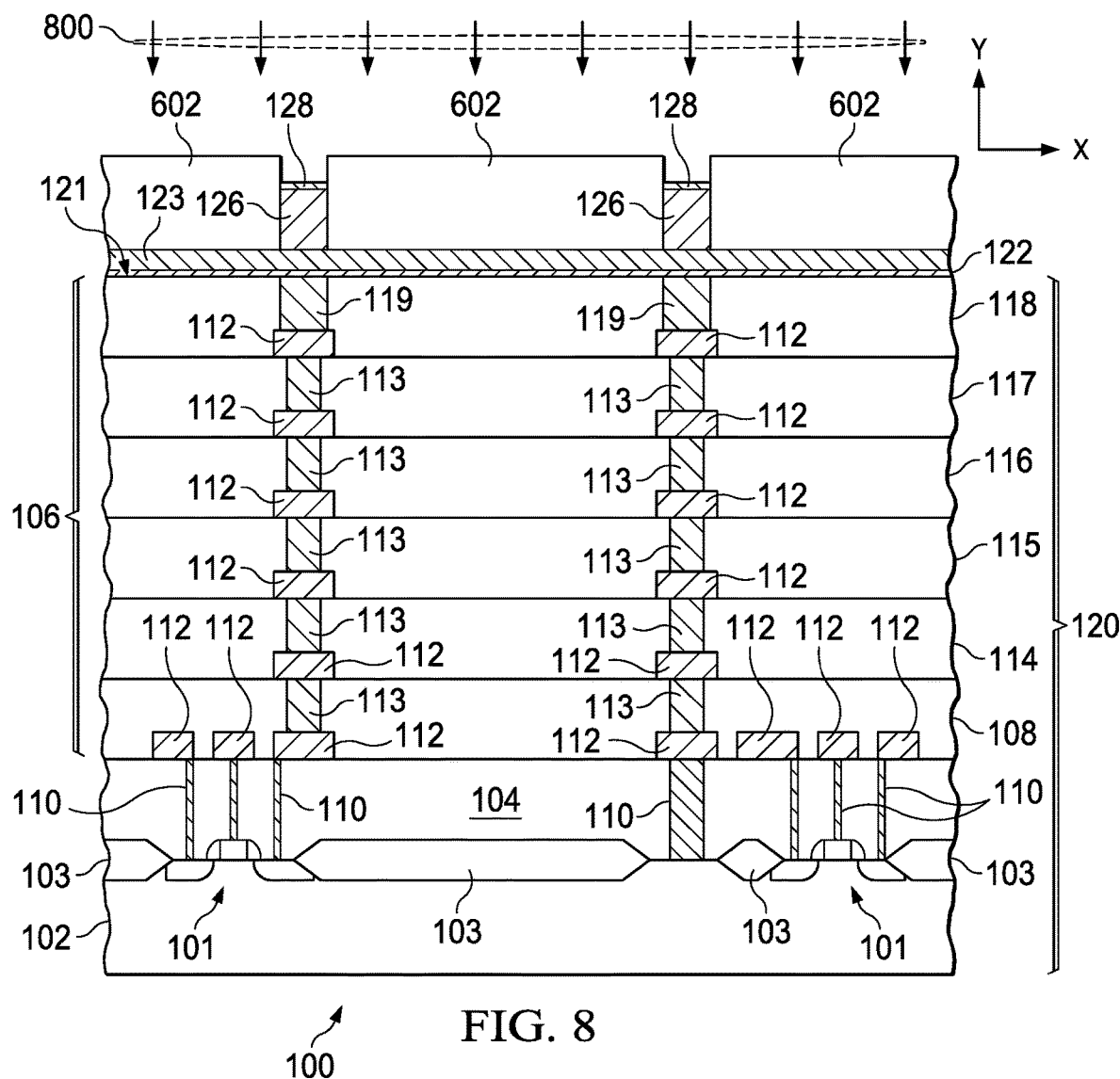

In one example, the contact structures 132 also include a diffusion barrier layer (e.g., 128 in FIG. 1), and solder (e.g., 130) above the deposited copper structures 126. In this example, the method 200 further includes forming a diffusion barrier layer at 216 in FIG. 2. FIG. 8 shows an example process 800 that forms a diffusion barrier layer 128 on the portions of the copper structures 126 exposed through the photoresist 602. In one example, the process 800 forms a nickel material (Ni) diffusion barrier layer 128 on the exposed portions of the copper structures 126. In another example, the diffusion barrier formation at 216 is omitted.

Figure 9:
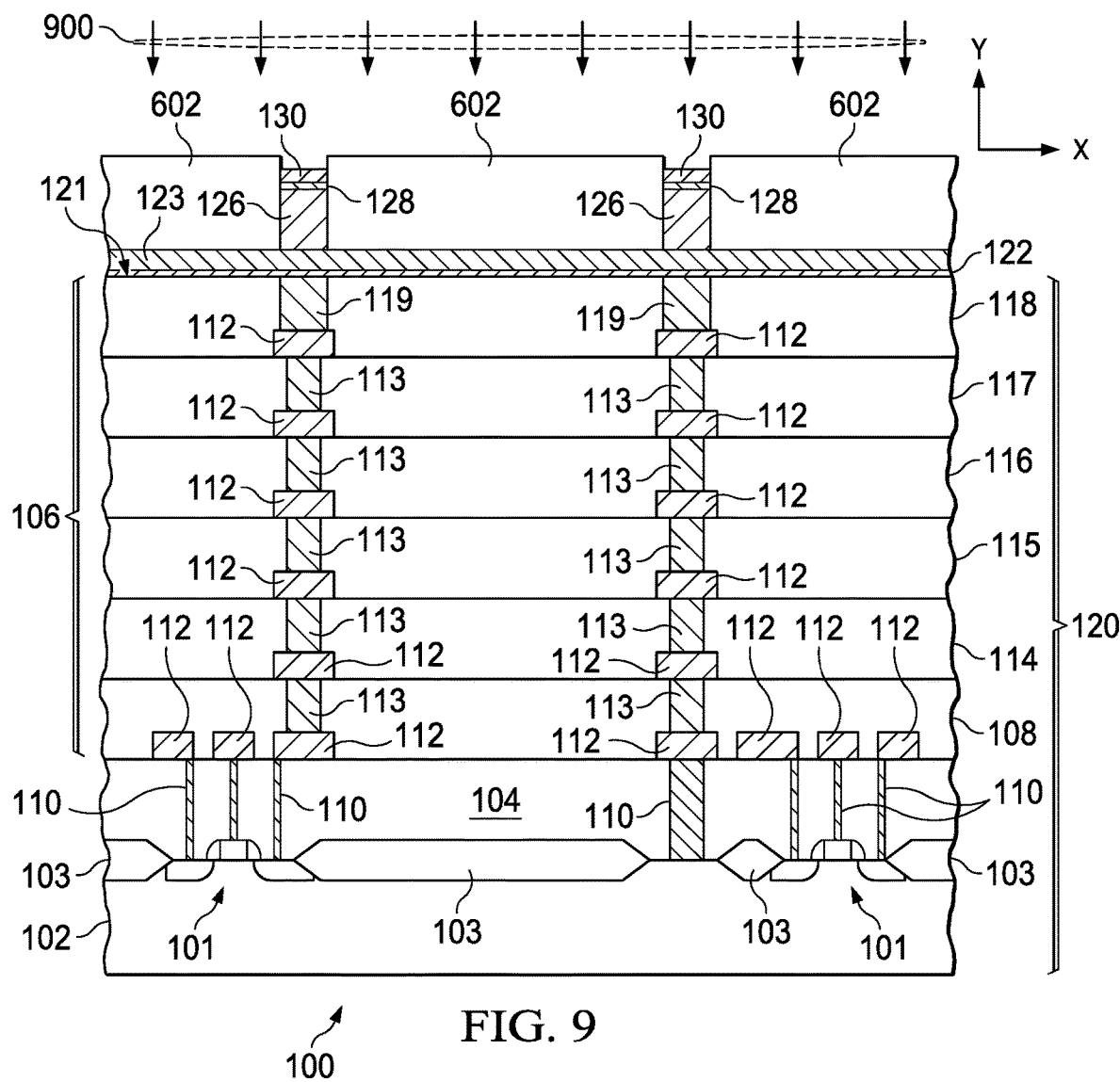

In the example of FIG. 2, the method 200 further includes forming solder at 218 on the diffusion barrier layer (if included), or forming solder at 218 directly on the exposed portions of the copper structures 126. FIG. 9 shows an example process 900 that forms solder (e.g., tin silver or SnAg) 130 on the diffusion barrier layer 128 above the copper structure 126. In one example, the solder 130 is formed by an electroplating process 900 at 218. In another example, the solder deposition at 218 and the diffusion barrier formation at 216 are omitted.

Figure 10:
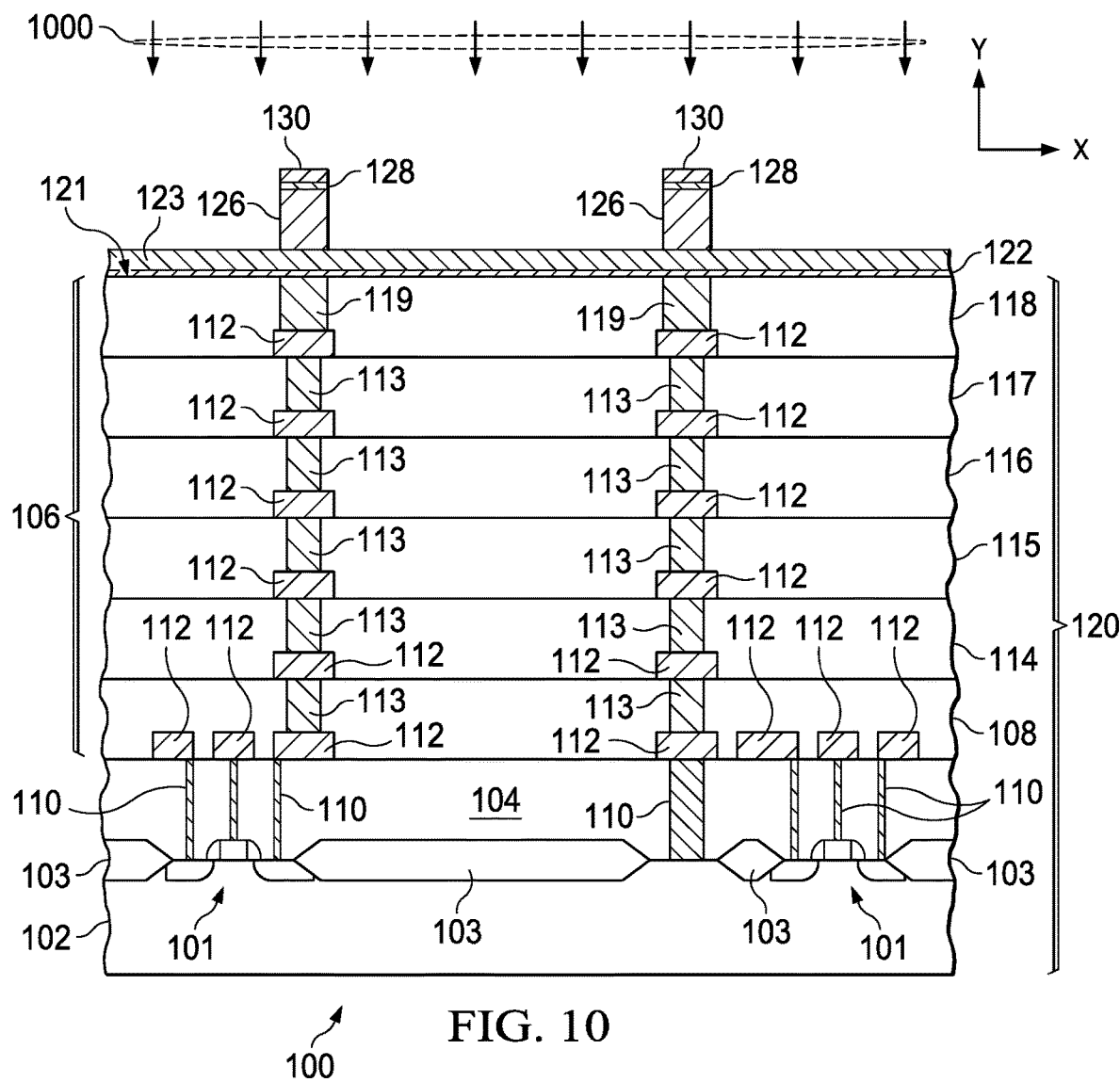

The method 200 continues at 220 in FIG. 2 with removal of the remaining resist layer. FIG. 10 shows a photoresist removal process 1000 (e.g., selective etch) that removes the photoresist material 602 from the wafer 120. Although the example method 200 is illustrated and described above using a damascene type process to form the copper structures 126 using a pattern photoresist 602, other processing steps can be used to form a conductive copper structure on the seed layer above the conductive feature 119 of the wafer 120. Moreover, although the illustrated example wafer 120 includes multiple conductive features 119 and corresponding contact structures 132, other implementations are possible in which only a single contact structure 132 is formed, and further examples are possible in which more than two contact structures 132 are formed.

Figure 11:
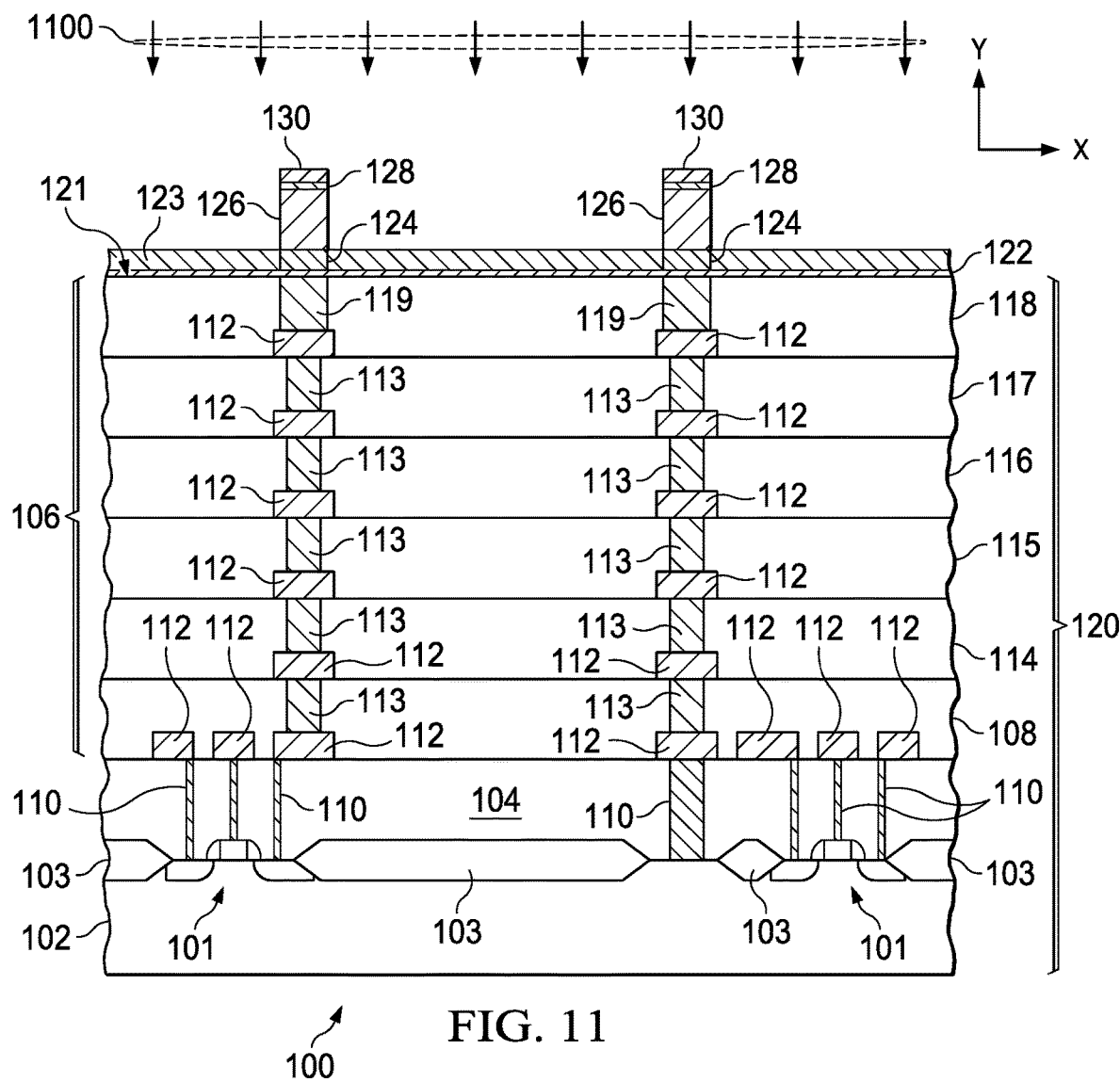

Continuing at 222 in FIG. 2, the method 200 also includes heating the seed layer 123 and the copper structure 126 to form a bronze material 124 between the barrier layer 122 and the copper structure 126. FIG. 11 shows an example in which an annealing process 1100 is performed at a temperature sufficient to react the deposited tin seed layer 123 with the overlying electroplated copper 126 to form the bronze material 124 between the underlying barrier layer 122 and the overlying electroplated copper structures 126 above the corresponding conductive features 119 of the wafer 120. In one example, the annealing process 1100 causes diffusion of tin and copper at the interface of the copper post structure 126 resulting on formation of bronze material 124 as shown in FIG. 11.

Figure 12:
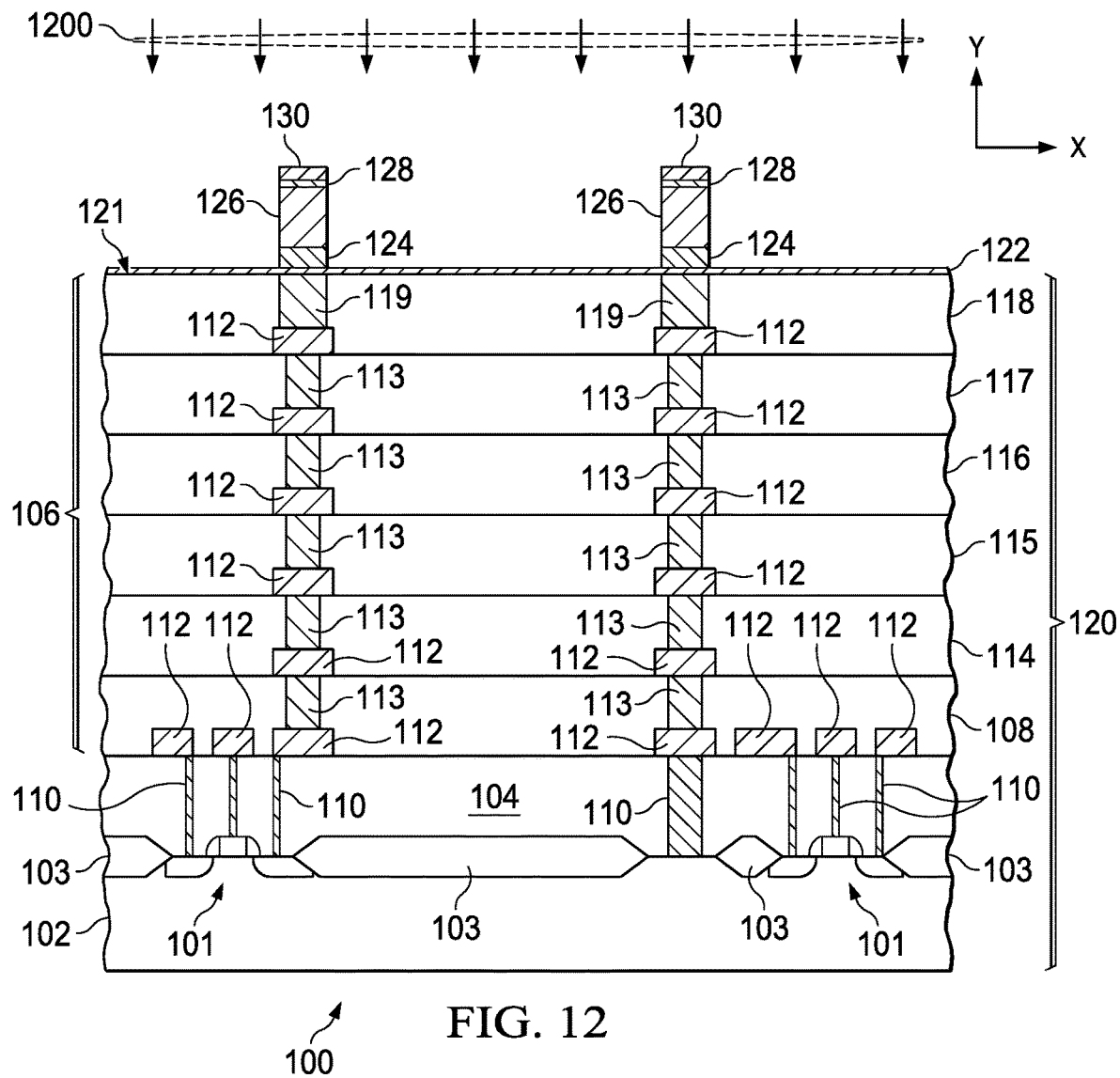

The method 200 further includes removing the exposed portion(s) of the remaining tin seed layer 123 to expose a portion of the barrier layer 122 at 224 in FIG. 2. FIG. 12 shows an example in which an etch process 1200 is performed that etches the exposed tin seed layer 123. The process 1200 selectively removes an exposed portion of the tin seed layer 123 to expose a portion of the barrier layer 122 as shown in FIG. 12. In one example, the etch process 1200 uses an acidic stripping solution (e.g., Enstrip TL-105 from Enthone by immersing the wafer 120 into the solution, where no current is required). The etch process 1200 selectively removes the exposed portion of the tin seed layer 123 from an underlying portion of the barrier layer 122. In another example, the tin seed layer 123 is selectively removed at 224 substantially without removing copper 126 either by immersion into hot solution of potassium hydroxide or sodium hydroxide. Alternatively, Enstrip TL-105 (from Enthone) can be used by immersing the work specimen into this solution and no current is required. Other selective etch processes 1200 can be used, for example, using a solution designed for removing of tin from copper and copper alloys. The use of the process 1200 to selectively remove the remaining (e.g., unreacted) seed layer material 123, and the previously diffused bronze material 124 between the copper 126 and the Ti/TiW barrier layer 122 mitigates or avoids the undercut issue found in alternate processes that use a sputtered copper seed layer (not shown).

Figure 13:
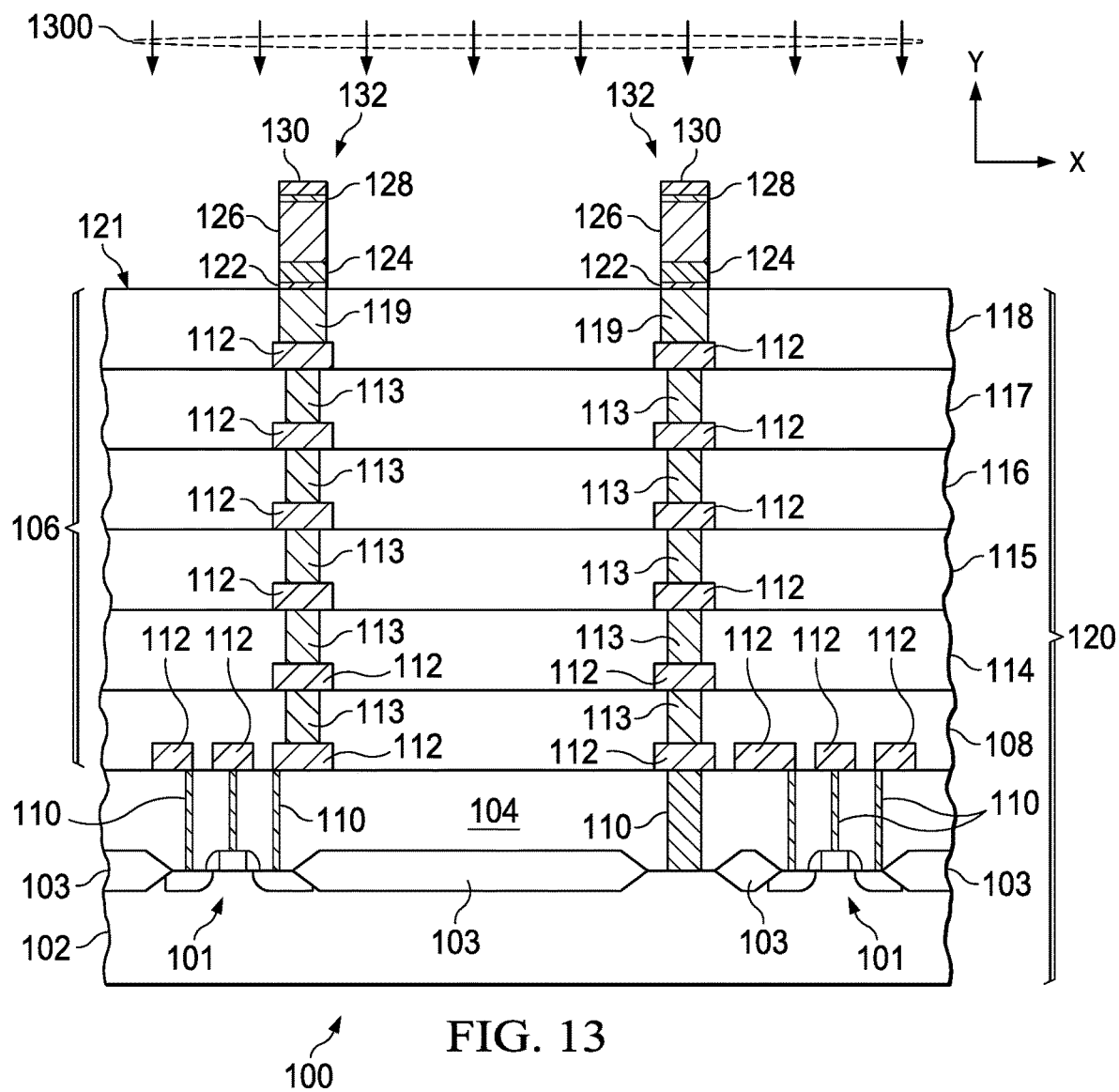
Figure 14:
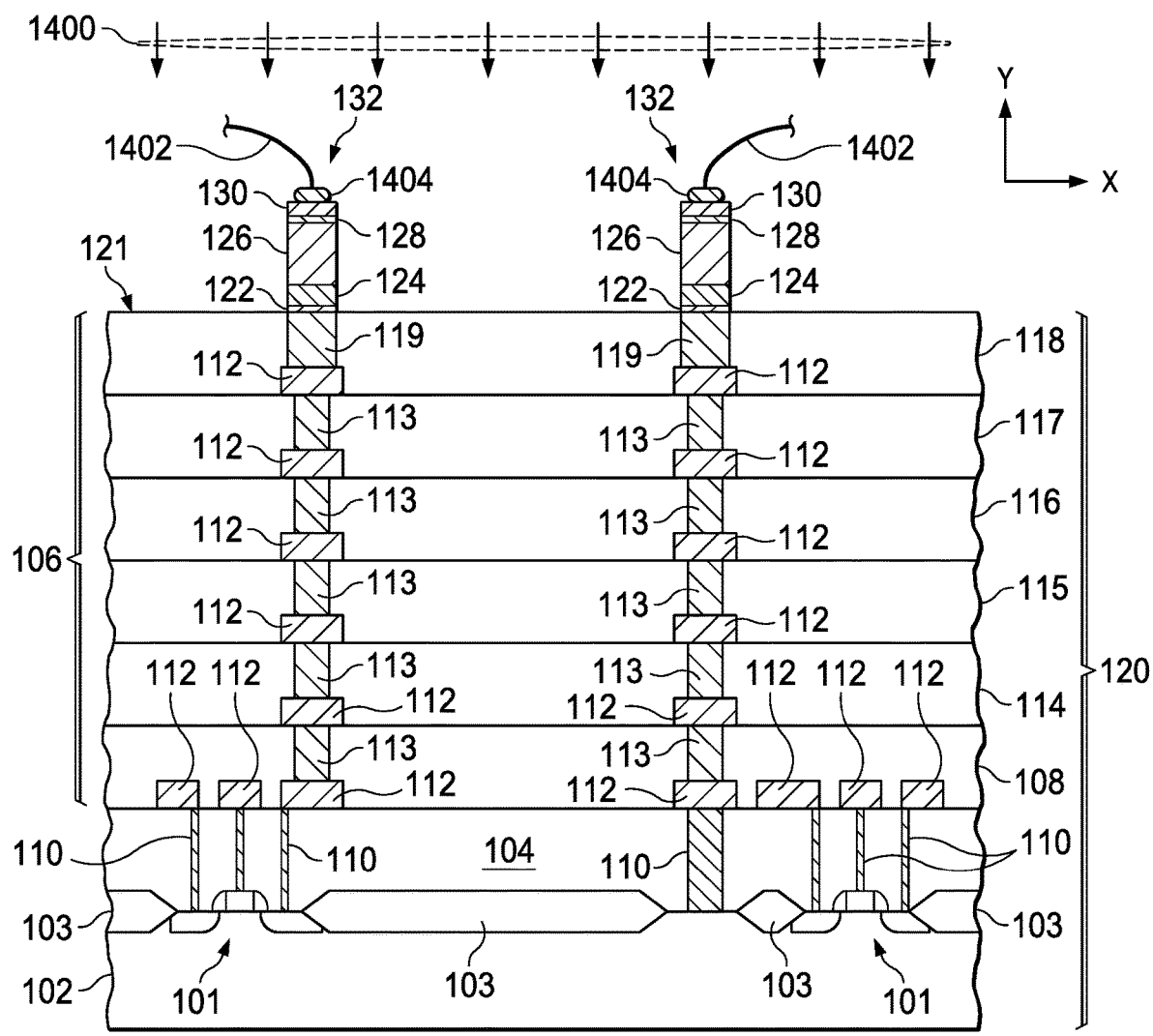
FIG. 14 is a partial sectional side elevation view of a microelectronic device with bond wires soldered to contact structures.
Figure 15:
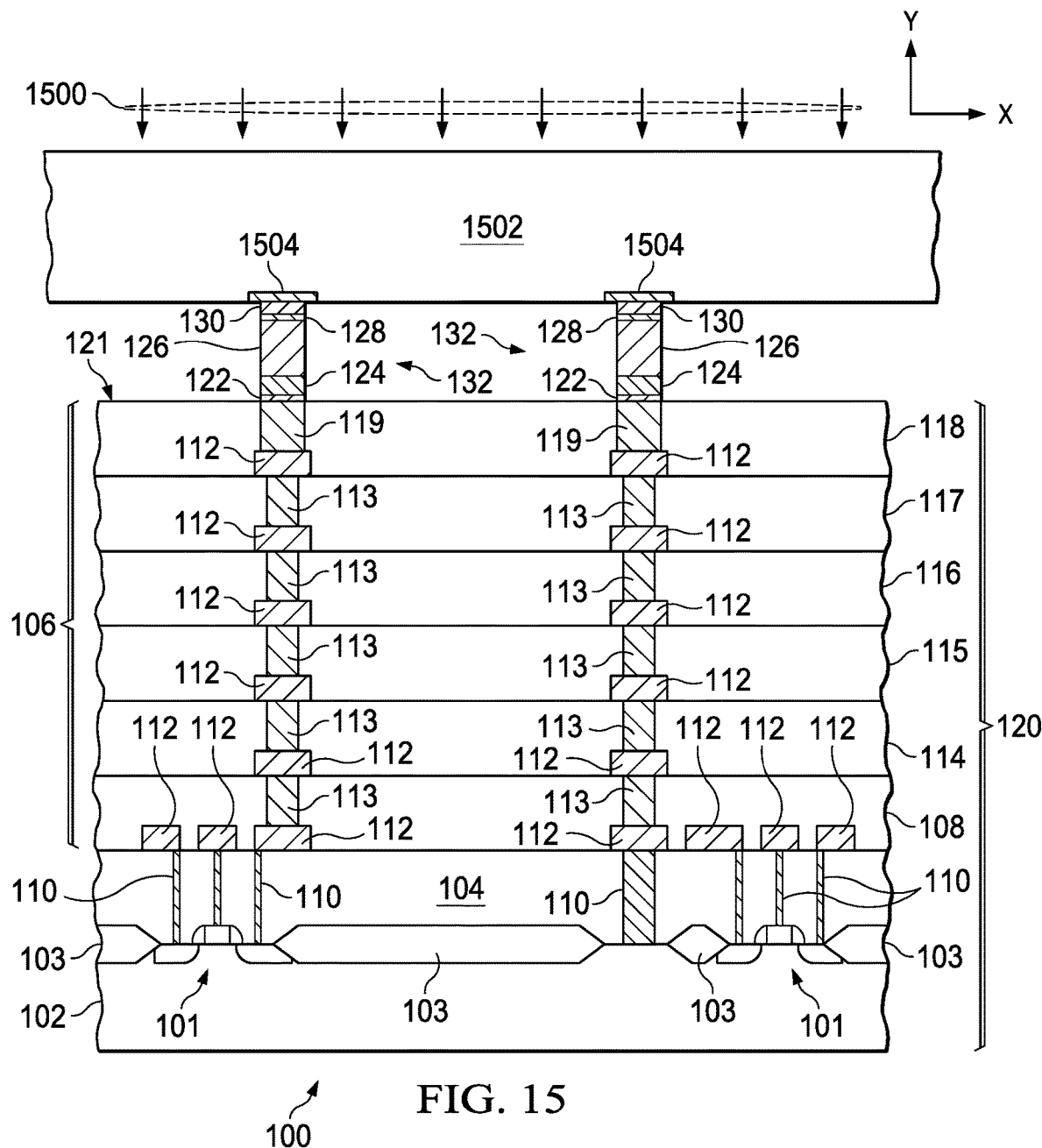
FIG. 15 is a partial sectional side elevation view of a microelectronic device with contact structures soldered to a flip-chip substrate.

The process 200 continues at 226 in FIG. 2 with removal of the exposed barrier layer 122. FIG. 13 shows one example using a selective etch process 1300 that removes the exposed portions of the barrier layer 122 between the contact structures 132. The microelectronic device fabrication process 200 concludes at 228 with die singulation and (e.g., separation of the wafer 120 into two or more dies), and packaging of individual microelectronic device dies. FIG. 14 shows one example packaged microelectronic device 100 undergoing a packaging process 1400 that solders the bond wires 1402 to the constructed contact structures 132 using solder 1404. FIG. 15 shows another example in which the microelectronic device 100 undergoes a flip-chip soldering process 1500 that solders the constructed contact structures 132 to conductive pads or features 1504 of a flip-chip substrate 1502.

Figure 16:
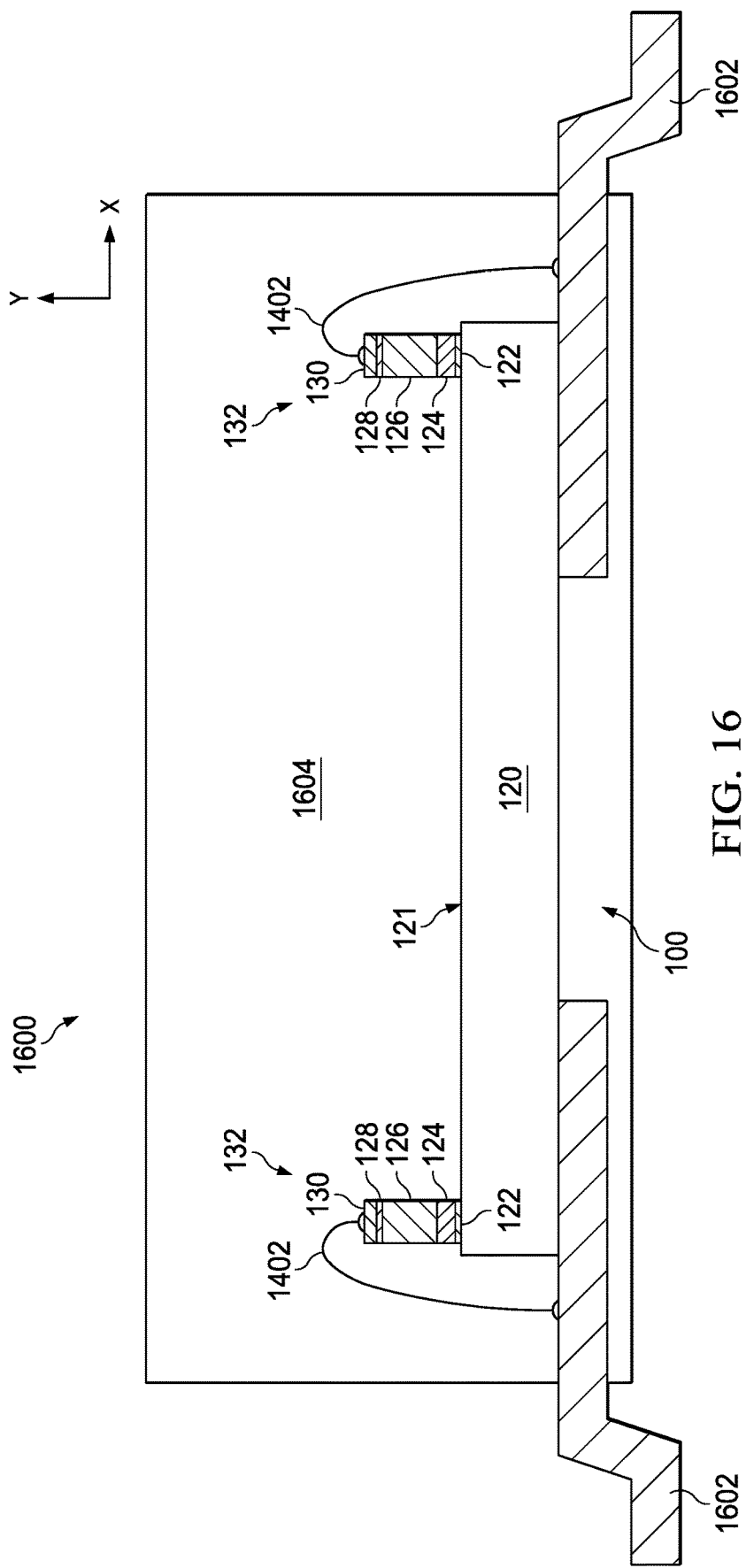
FIG. 16 is a partial sectional side elevation view of a packaged integrated circuit microelectronic device with bond wires soldered between contact structures and a leadframe in a molded package.

A finished microelectronic device 100 can include other features, such as molded or ceramic packaging material, lead frames, solder bumps, etc. FIG. 16 shows an example integrated circuit (IC) 1600 that includes the microelectronic device 100. This example includes bond wires 1402 (e.g., FIG. 14 above) soldered between the contact structures 132 and electrical conductors 1602 (e.g., leads, pins or pads) of a leadframe. The example IC 1600 also includes a molded package material 1604 (e.g., plastic) that encloses the die 120, the contact structures 132, the bondwires 1402 and portions of the electrical conductors 1602. The example electrical conductors 1602 are IC pins or pads that can be soldered to a host printed circuit board (PCB, not shown).

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

What is claimed is:

1. A microelectronic device, comprising:
an electronic component disposed on or in a semiconductor substrate of a wafer or die;
a metallization structure, including a conductive feature; and
a contact structure, including:
a barrier layer disposed at least partially on the conductive feature,
a copper structure that extends at least partially outward from a side of the metallization structure, and
a bronze material disposed between the barrier layer and the copper structure.

2. The microelectronic device of claim 1, wherein the barrier layer includes titanium or titanium tungsten.

3. The microelectronic device of claim 2, wherein the contact structure further includes solder on or above the copper structure.

4. The microelectronic device of claim 3, wherein the contact structure further includes a diffusion barrier layer disposed between the copper structure, and the solder.

5. The microelectronic device of claim 1, wherein the contact structure further includes solder on or above the copper structure.

6. The microelectronic device of claim 5, wherein the contact structure further includes a diffusion barrier layer disposed between the copper structure, and the solder.

7. A contact structure, comprising:
a barrier layer at least partially on a conductive feature of a wafer or die;
a seed layer at least partially on the barrier layer, the seed layer including tin;
a copper structure on the seed layer above the conductive feature of the wafer or die;
a bronze material between the barrier layer and the copper structure;
an exposed portion of the seed layer exposing a portion of the barrier layer; and
the exposed portion of the barrier layer is removed.

8. The contact structure of claim 7, wherein the barrier layer includes titanium or titanium tungsten.

9. The contact structure of claim 8, wherein the copper structure on the seed layer includes:
a resist layer on the seed layer; and
copper material on exposed portions of the seed layer.

10. The contact structure of claim 9, wherein the copper material on the exposed portion of the seed layer includes electroplated copper material on the exposed portion of the seed layer.

11. The contact structure of claim 8, wherein an exposed portion of the seed layer from an underlying portion of the barrier layer is removed.

12. The contact structure of claim 7, wherein the copper structure on the seed layer includes:
a resist layer on the seed layer;
an exposed portion of the seed layer above the conductive feature of the wafer or die; and
copper material on the exposed portion of the seed layer.

13. The contact structure of claim 12, wherein selective underlying portions of the barrier layer are removed.

14. The contact structure of claim 7, wherein selective portions of the exposed seed layer are removed from an underlying portion of the barrier layer.

15. The contact structure of claim 7, further comprising: solder on or above the copper structure.

16. The contact structure of claim 15, further comprising:
a diffusion barrier layer on the copper structure; and
solder on the diffusion barrier layer above the copper structure.

17. A microelectronic device, comprising:
an electronic component on or in a semiconductor substrate;
a metallization structure above the semiconductor substrate, including a conductive feature along a side of the metallization structure;
a contact structure, including:
a titanium or titanium tungsten barrier layer at least partially on the conductive feature,
a tin seed layer at least partially on the barrier layer,
a copper structure on the seed layer above the conductive feature of the wafer or die,
a bronze material between the barrier layer and the copper structure; and
a bond wire or a flip-chip substrate attached to the contact structure.

18. The microelectronic device of claim 17, wherein the copper structure on the seed layer includes:
a resist layer on the seed layer; and
copper material on an exposed portion of the seed layer.

19. The microelectronic device of claim 17, further comprising:
solder on or above the copper structure.

20. The microelectronic device of claim 17, further comprising:
a diffusion barrier layer on the copper structure; and
solder on the diffusion barrier layer.

* * * * *